United States Patent [19]

Furgason

[11] Patent Number: 4,806,907
[45] Date of Patent: Feb. 21, 1989

[54] APPARATUS AND METHOD FOR DIGITAL DATA TRANSMISSION

[76] Inventor: Leon M. Furgason, P.O. Box AK, Harlowton, Mont. 59036

[21] Appl. No.: 892,422

[22] Filed: Aug. 4, 1986

[51] Int. Cl.⁴ .............................................. H03M 7/00
[52] U.S. Cl. ........................................ 341/50; 360/39; 360/40; 328/111; 328/112
[58] Field of Search ............. 340/347 DD; 360/39–44; 328/111, 112

[56] References Cited

U.S. PATENT DOCUMENTS

| | | | |
|---|---|---|---|
| 2,887,674 | 5/1959 | Greene | 360/44 |
| 3,720,927 | 3/1973 | Wolf | 360/44 |
| 3,959,816 | 5/1976 | Spiecens | 360/44 |
| 3,996,586 | 12/1976 | Dillon et al. | 340/347 DD |
| 4,233,525 | 11/1980 | Takahashi et al. | 328/112 X |

OTHER PUBLICATIONS

The Engineering Staff of Analog Devices, Inc., Analog–Digital Conversion Handbook, 6/1972, pp. I-8 & I-9, II-80 & II-81.

*Primary Examiner*—William M. Shoop, Jr.
*Assistant Examiner*—Richard K. Blum
*Attorney, Agent, or Firm*—Richard C. Conover

[57] ABSTRACT

An apparatus and method for encoding a digital data signal, which apparatus and method converts a digital data signal to a string of truncated and extended pulses, the truncated pulses corresponding to a digital "0" and the extended pulses corresponding to a digital "1". The frequency of the leading edges of all of the pulses in this pulse string is the clock frequency such that a clock signal can be generated by the receiver directly to synchronize the receiver to the transmitter. Further, the trailing edge of the transmitted pulses contain the data information. Specifically, the pulses are varied in length with a truncated pulse corresponding to a digital "0" and an elongated pulse corresponding to a digital "1". A decoding apparatus is also described for decoding the encoded signal to generate a digital signal corresponding to the original data signal to be encoded.

6 Claims, 3 Drawing Sheets

APPARATUS AND METHOD FOR DIGITAL DATA TRANSMISSION

BACKGROUND OF THE INVENTION

The present invention relates to a method and apparatus for encoding digital data for transmission or recording and also a method and apparatus for decoding the encoded signal produced by the encoder apparatus.

There are a number of methods and devices for encoding electrical signals for transmission over a long cable or for recording on a medium such as magnetic discs or tapes. Some of the more commonly known types of digital data encoding methods include the method of frequency-encoding digital signals such as described in U.S. Pat. No. 4,441,193. In these systems, a predetermined frequency signal represents the digital "1" and a different predetermined frequency signal represents digital "0". Through circuitry at the receiver, these various frequencies are separated from the transmitted signal and a digital signal is reconstructed. The receiver, however, must be synchronized with the transmitter so that the data information can be determined. One way of doing this is to provide a separate synchronizing clock signal in addition to the data signal being transmitted. The receiver recognizes this clock signal and clocks the receiving circuit to receive the incoming data.

Another method involves what is called phase encoding of data. This method of encoding is described, for example, in U.S. Pat. No. 4,532,559 to Long et al in which the transition from one level to another level, for example from a "0" to a "1", is used to represent data values rather than their absolute values. For example, an output signal transition in one direction from high voltage to low voltage is used to represent a binary "0", and a transition in the other direction, low voltage to high voltage, is used to represent a binary "1". An advantage of phase encoding digital type systems is that it is "self clocking". More specifically, it is not necessary for the transmitted signal to include a separate clock signal to synchronize the receiver with the transmitter. In a phase encoding method, the data transitions occur with sufficient regularity that a clock signal can be derived from the data being transmitted in a well known manner by using averaging methods.

SUMMARY OF THE INVENTION

The present invention is an improvement over known data encoding equipment and methods. The transmittal signal according to the present invention is a string of truncated and extended pulses, the truncated pulses correspond to a digital "0" and the extended pulses correspond to a digital "1". Further, the frequency of the leading edges of all the pulses is the clock frequency such that a clock signal can be generated by the receiver directly to synchronize the receiver to the transmitter.

With the present invention, the leading edge of each pulse encoded by this technique contains the information regarding the frequency of the clock signal, and the trailing edge of the transmitted pulse contains the data information. Specifically, the pulse is varied in length with a truncated pulse corresponding to a digital "0" and an elongated pulse corresponding to a digital "1".

With the present invention, data can be transmitted at the clock rate and a separate clock signal is not necessary. Further, many of the problems known in the prior art such as "bit shifting" described in U.S. Pat. No. 4,532,559 would not be present since it is only the length of the pulses which determine the information of the signal and each pulse has the clock information on the leading edge. Many of the problems with phase encoding of data, for example, occurred because there was no signal transmitted for a binary "0", thus the clock signal had to be derived from the overall string of pulses. With phase encoding apparatus, complicated averaging circuits and other types of circuits are provided to indirectly derive a clock signal so that the receiver can be synchronized with the transmitter. All of these other circuits can be eliminated with the present invention.

BRIEF DESCRIPTION OF THE DRAWINGS

In order that the invention may be clearly understood and readily carried into effect, a preferred embodiment of the invention will now be described, by way of example only, with reference to the accompanying drawings wherein.

DESCRIPTION OF A PREFERRED EMBODIMENT

Figure 1:
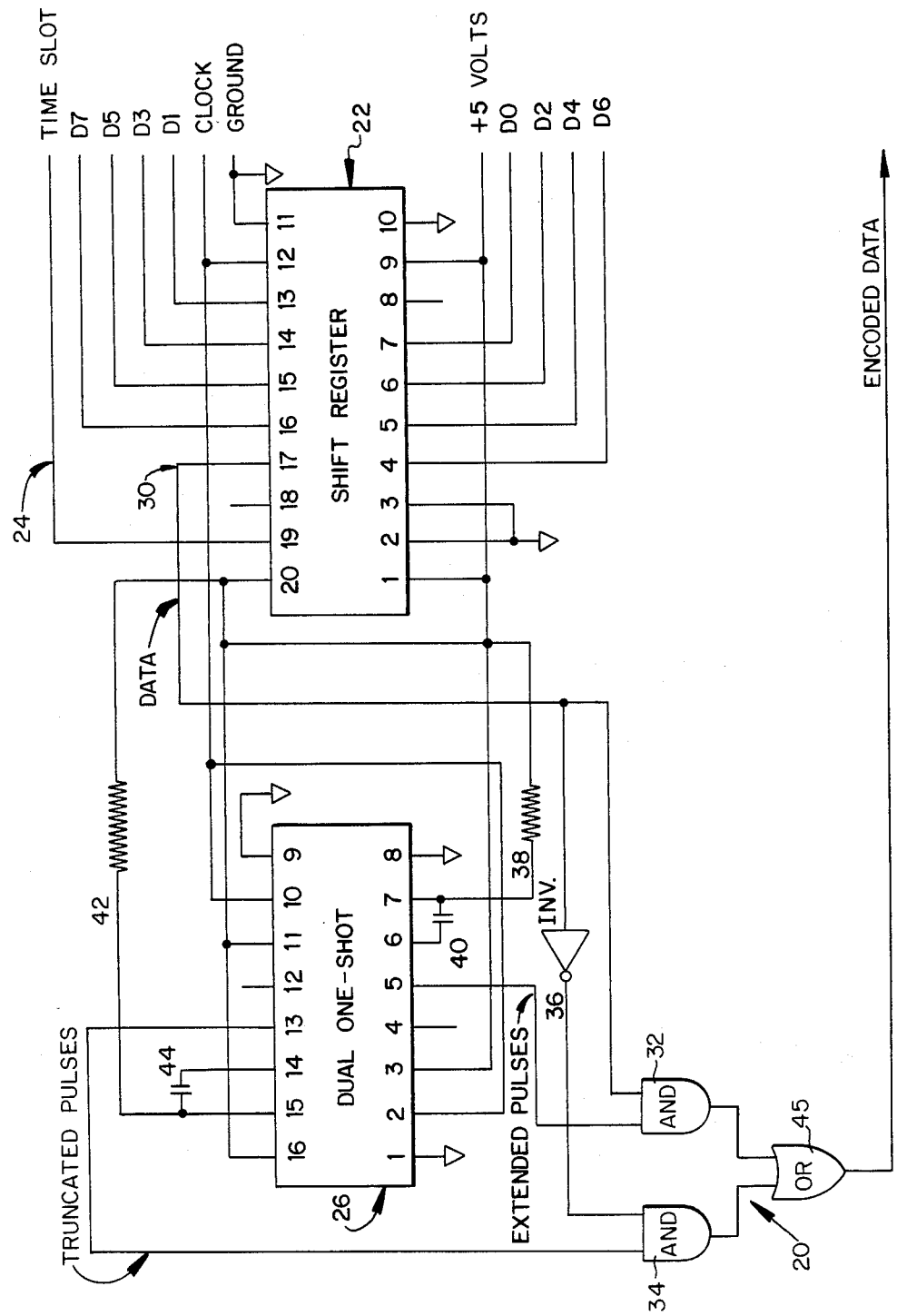
FIG. 1 is a schematic block diagram of the digital data encoder.

A digital data encoder 21 is shown schematically in FIG. 1. This encoder includes a conventional shift register 22 such as Model 74HC299 manufactured by the National Semiconductor Company. This shift register 22 is described in the "1984 CMOS Databook" distributed by National Semiconductor Company and this manual is hereby incorporated by reference. The shift register 22 has terminals numbered 1 through 20 as shown in FIG. 1.

A positive voltage source (not shown) which supplies a +5 volts (VCC) is applied to terminals 1, 9 and 20 of the shift register 22. The terminals 2, 3, 10 and 11 of shift register 22 are connected to ground. A clock pulse from a conventional clock signal source (not shown) is applied to terminal 12 of the shift register 22.

In the embodiment shown in FIG. 1, an eight bit digital signal is to be encoded for transmission. Each bit of the digital signal is applied to the shift register 21 through the leads D0-D7 as indicated in FIG. 1. These leads are connected to the shift register 22 as follows: D0 to terminal 7 of shift register 22; D1 to terminal 13; D2 to terminal 6; D3 to terminal 14; D4 to terminal 5; D5 to terminal 15; D6 to terminal 4; and D7 to terminal 16.

A time slot lead 24 transmits information concerning the byte size of the digital signal to be transmitted to terminal 19 of the shift register 22. This time slot information is produced by a source not shown and depends upon the byte size to be transmitted.

The shift register 22 is used to prepare the data to be transmitted for encoding. Essentially, the data to be transmitted is clocked into the shift register 22 through the leads D0-D7 and the information as to the byte size of the information to be transmitted is also transmitted to the shift register through lead 24. Once the data has been clocked into the shift register, the data is then ready for encoding. In order to accomplish the encoding, a conventional dual one shot 26, such as Model 74HC123 manufactured by the National Semiconductor Company is used. This dual one shot 26 is described in the "1984 CMOS Databook", which manual is also incorporated herein by reference. This dual one shot 26 has sixteen terminals numbered 1 through 16 as shown in FIG. 1. Terminals 4 and 12 of this dual one shot 26 are not used. The +5 volt signal (VCC) is applied to terminals 16, 11 and 3 directly. Terminals 1, 8 and 9 of dual one shot 26 are grounded. The clock pulse transmitted to the shift register 22 is connected to terminals 2 and 10 of the dual one shot 26. When the data is to be encoded, the data which is located in shift register 22 is transmitted via line 30 connected to terminal 17 of the shift register 22 to an AND gate 32 and also to an AND gate 34 through an invertor 36 as shown in FIG. 1. The data to be transmitted is going to be converted with these two AND gates from a pulse corresponding to a digital "1" to a positive pulse having an extended length from a digital "0" which is represented by the absence of a pulse to a positive pulse of a truncated length, as will be described.

The extended pulses representing the digital "1" are created by the dual one shot 26. The length and time of these pulses is determined by a conventional RC circuit consisting of a resistor 38 and a capacitor 40. The resistor 38 is connected to the positive source (VCC) and has its other end electrically connected to terminal 7 of the dual one shot 26 and to terminal 6 of dual one shot 26 through the capacitor 40.

The truncated pulses representing the digital "0" are created by another RC circuit comprising a resistor 42 and a capacitor 44. The resistor 42 is connected directly to the positive source (VCC) and to the terminal 15 of dual one shot 26. This resistor 42 is also electrically connected in parallel to terminal 14 of dual one shot 26 through the capacitor 44.

Figure 3:
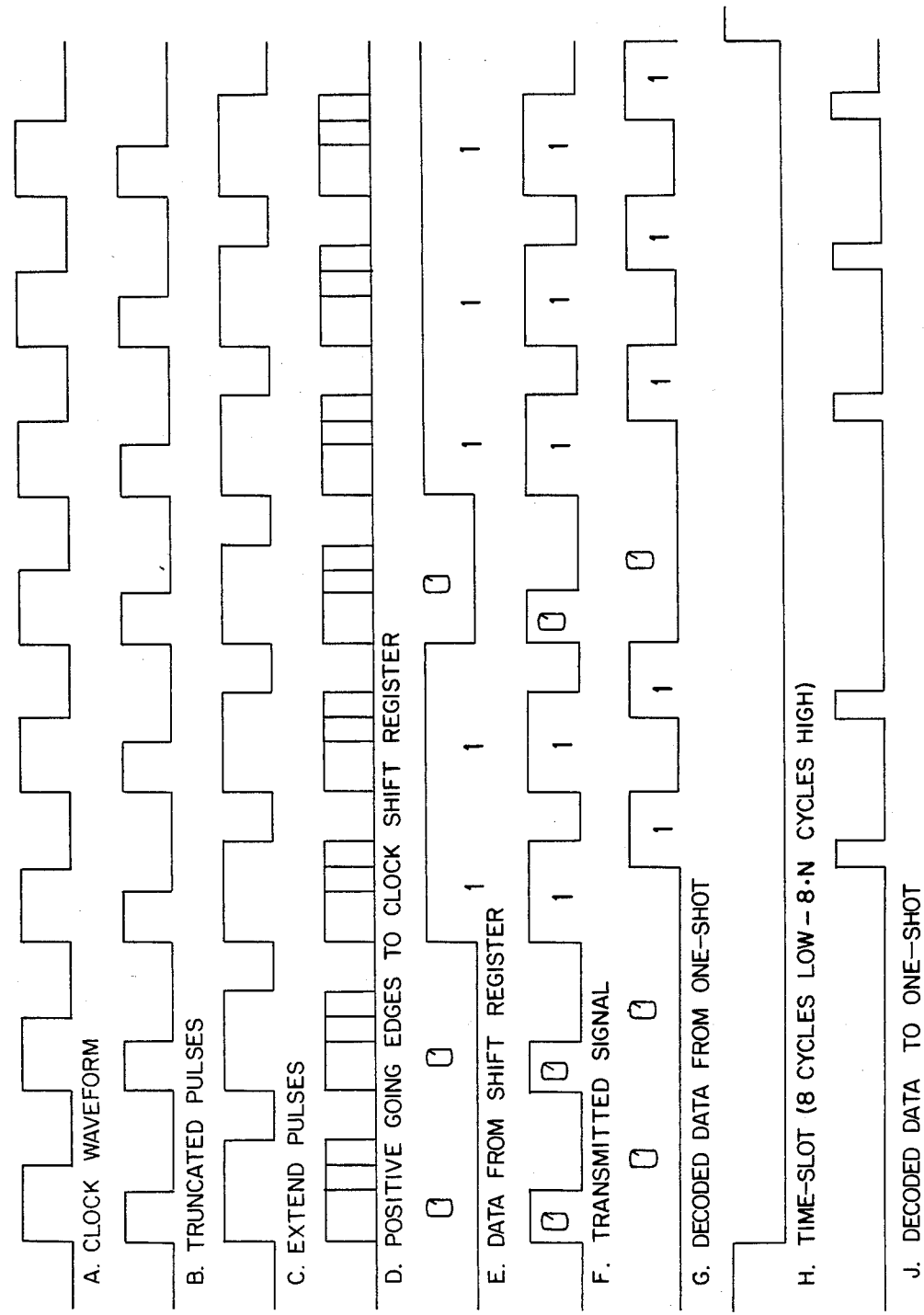
FIG. 3 is a diagram of electrical waveforms A-J at selected points in the circuits shown in FIGS. 1 and 2.

With this arrangement, a series of truncated pulses is created by the dual one shot 26 at terminal 13 of dual one shot 26 and as shown in waveform B of FIG. 3. The extended pulses appear at terminal 5 of dual one shot 26 as a series of pulses and as shown in waveform C of FIG. 3.

The truncated pulses from terminal 13 of dual one shot 26 are transmitted to the second terminal of AND gate 34 as shown in FIG. 1. The extended pulses appearing at terminal 5 of the dual one shot 26 are directed to the second terminal of the AND gate 32, as also shown in FIG. 1. The output of AND gates 32 and 34 are directed to an OR gate 45 and the output of the OR gate 45 is either a truncated pulse or an extended pulse, depending on whether the bit to be transmitted is a binary "0" or a binary "1" respectively.

In operation, the digital byte to be transmitted is clocked into the shift register 22 as previously described. Once in the shift register, the bits of the digital byte is transmitted from terminal 17 to the AND gates 32 and 34 also as previously described. If the bit being transmitted is a digital "1", the AND gate 32 will permit an extended pulse to be transmitted through the OR gate 45 for the reason that both terminals to the AND gate are at the higher voltage level corresponding with the logic digital signal "1". On the other hand, the AND gate 34 has a "1" at the terminal for the truncated pulses but has a "0" from the invertor 36 at the other terminal. Therefore the AND gate 34 will not transmit a truncated pulse.

Considering the reverse situation, that is, the data to be transmitted from terminal 17 of the shift register 22 is a digital "0", it can be seen that the AND gate 32 will not transmit an extended pulse but the AND gate 34 will transmit a truncated pulse.

Thus, the encoded signal to be transmitted appears at the output of the OR gate 45.

With reference to FIG. 3, the waveform A shows the clock waveform which is produced by the clock generator and is applied to both the shift register 22 and the dual one shot 26. Waveform B shows the truncated pulses which are created by the dual one shot 26 at terminal 13 thereof. The dual one shot is configured to produce a truncated pulse each time the clock pulse is in transition from a low voltage to a high voltage. Similarly, the dual one shot 26 produces a series of extended pulses at terminal 5 thereof, the extended pulses having leading edges which correspond to the transition of the clock pulse from the low voltage to the high voltage as shown in waveform C of FIG. 3.

Waveform E shown in FIG. 3 shown an example of the data to be transmitted. This data is one byte which consists of eight bits, and for this example, is the byte "00110111" (corresponding to the decimal number "55"). The time slot information is shown in waveform H of FIG. 3 which again provides a window for eight bits to be transmitted. Once the data from the shift register shown in waveform E of FIG. 3 is applied to the AND gates 32 and 34, the encoded signal having a series of truncated and elongated pulses as shown in waveform F appears at the output of OR gate 45. This signal to be transmitted has a truncated signal corresponding to the digital "0", and the leading edge of this truncated pulse corresponds to the transition of the clock pulse from a low voltage to a high voltage. The digital "1" to be transmitted consists of an extended pulse which also has a leading edge which corresponds to the transition of the clock waveform from the low voltage to the high voltage.

Thus the leading edge of each of the pulses whether truncated or extended correspond to the transition from the low voltage to the high voltage in each cycle of the clock. Thus the clock information is contained in the leading edge of the transmitted signal. Further, the length of the pulse is determinative of the information being transmitted such that an extended pulse is digital "1" and a truncated pulse is a digital "0". Thus the trailing edge of the transmitted signal includes the information with respect to whether a digital "0" or a digital "1" is being transmitted.

Figure 2:
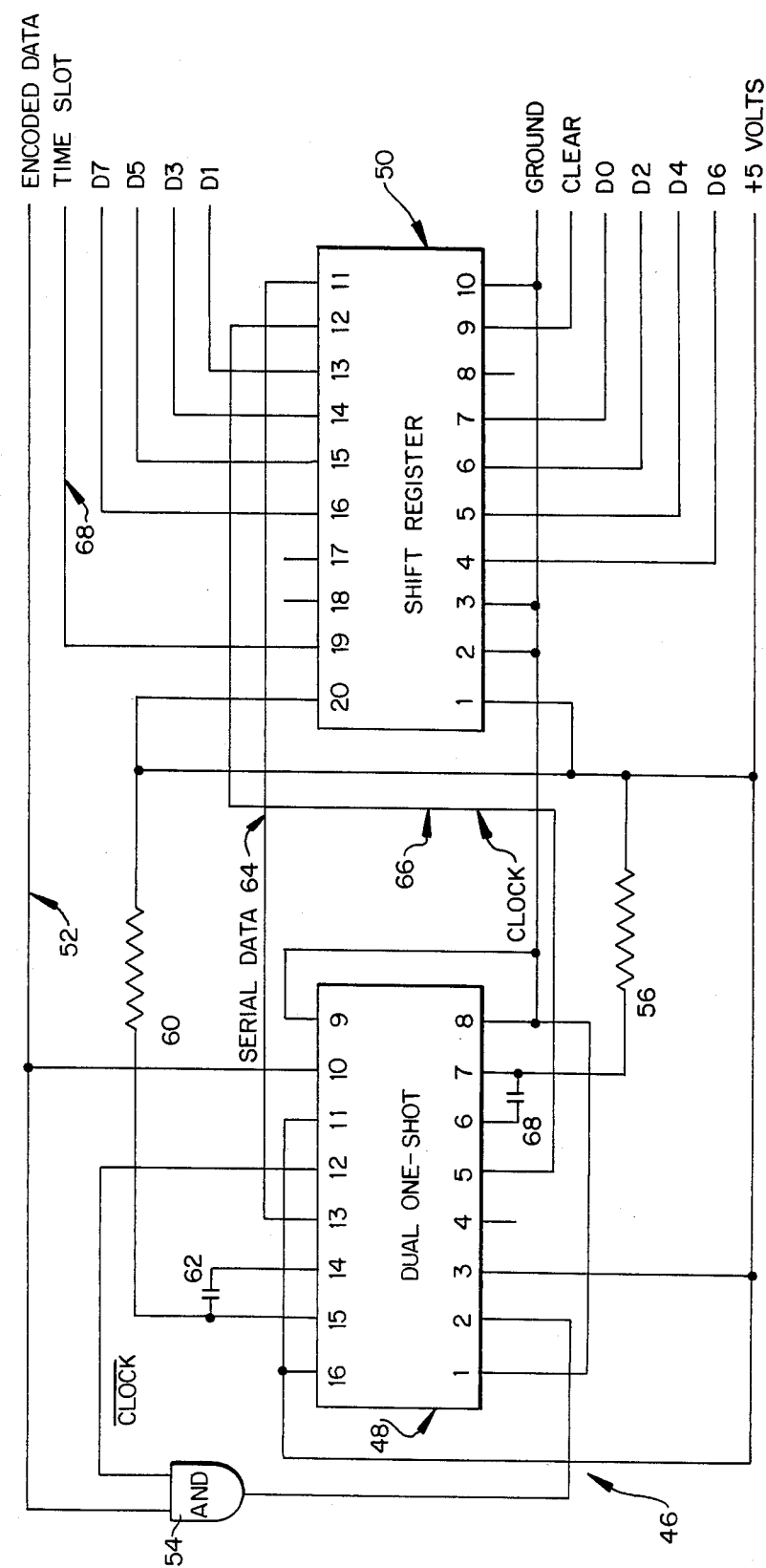
FIG. 2 is a schematic block diagram of a digital data decoder.

The digital decoder 46 is shown in FIG. 2. The schematic circuit is similar to the encoder circuit of FIG. 1 and includes a dual one shot 48 which is the same as dual one shot 26 in the encoder circuit 21 and also includes a shift register 50 which is similar to shift register 22 of the encoder circuit 21.

The encoded data transmitted from the encoder 20 is applied via lead 52 to an AND gate 54 and, at the same time, to terminal 10 of dual one shot 48. Leading edges of the transmitted signal as shown in waveform F of FIG. 3 contains the clock information and the leading edge always appears at the frequency of the clock signal. Therefore the dual one shot 48 recreates the clock signal which appears at terminal 5 of the dual one shot 48. Further, an inverted clock signal appears at terminal 12 of the dual one shot 48 and is transmitted to the second terminal of the AND gate 54 such that when the inverted clock waveform goes positive and the waveform of the transmitted signal is positive, a pulse appears at the output of the AND gate 54. Note that a pulse is provided only for the extended pulses, that is for the digital "1" of the transmitted signal. This is because only the portion of the extended pulse beyond the length of the clock pulse will be permitted to be transmitted through AND gate 54. There is no pulse formed for the digital "0" portion of the transmitted signal. The output of AND gate 54 is shown as waveform J of FIG. 3.

The output of the AND gate 54 is applied to terminal 2 of the dual one shot 48. A +5 volts (VCC) is applied to terminals 3, 11 and 16 of the dual one shot 48. Further, this +5 volts is applied to terminal 15 of the dual one shot 48 through resistor 60 and to terminal 14 through resistor 60 and capacitor 62. Further, the +5 volts is applied to terminal 7 of dual one shot 48 through resistor 60 and to terminal 6 through resistor 56 and capacitor 68. Terminals 1, 8 and 9 of the dual one shot 48 are connected to ground, as shown in FIG. 2.

The dual one shot 48, upon receipt of the signal from AND gate 54, recreates a data signal in which the binary signal includes pulses having approximately the same length as the original data signal corresponding to the digital "1" and wherein the binary "0" is represented by the absence of a pulse. This is accomplished with the RC circuits provided with resistor 56 and capacitor 58 and also resistor 60 and capacitor 62. The recreated data signal is shown as waveform G in FIG. 3. This data is clocked through lead 64 under the clock control appearing on lead 66 which is applied to terminal 12 of shift register 50 into the shift register 50 at terminal 11.

The +5 volts (VCC) is applied to terminals 1 and 20 of shift register 50. Terminals 2, 3 and 10, are connected to ground, and the time slot window recreated by shift register 50 appears on lead 68 connected to terminal 19 of shift register 50. The eight bits of data in the digital byte appear as follows: D0 at terminal 7, D1 at terminal 13, D2 at terminal 6, D3 at terminal 14, D4 at terminal 5, D5 at terminal 15, D6 at terminal 4 and D7 at terminal 16. Thus it is possible to reconstruct the digital signal which was encoded by the encoding apparatus 21 as shown in FIG. 1.

With the present invention, it is possible to transmit data which has been encoded with the encoder 21 at clock speeds, with the clock information being carried by each pulse of the pulse train being transmitted. This has the advantage that a separate clock signal is not required. Further, the averaging techniques to derive a clock signal as used in phase encoded data transmission is not required. There is a positive indication every time a pulse is transmitted, whether it be a digital "0" or a digital "1", which indicates the clock frequency so that the receiver can by synchronized to the transmitter.

It is further contemplated that the data in the encoded form as shown in waveform F of FIG. 3 could be recorded on a magnetic device such as a disc or tape or optical device. The signal recorded would again consist of a string of pulses with the clock information being carried by the leading edge of each pulse to synchronize the reading device, and with the data information, that is whether the datum is a digital "0" or a digital "1", being carried by the trailing edge of each pulse.

While the fundamental novel features of the invention have been shown and described, it should be understood that various substitutions, modifications and variations may be made by those skilled in the art without departing from the spirit or scope of the invention. Accordingly, all such modifications or variations are included within the scope of the invention as defined by the following claims.

I claim:

1. An electronic circuit for encoding a digital signal containing data information and consisting of the string of pulses of two different states, the pulse of the first state representing a digital "1" and the pulse of the second state representing a digital "0" comprising:

shift register means for receiving the digital signal to be encoded from an external source which digital signal is clocked into the shift register means under control of a clock signal consisting of a square wave and a clock frequency;

means for generating pulses of truncated length, the truncated pulses having a leading edge corresponding to a leading edge of the clock pulse and appearing at the clock frequency, and having a pulse width less than the pulse width of the clock signal;

means for generating pulses of extended length, the extended pulses having a leading edge corresponding to a leading edge of the clock pulse and occurring at the clock frequency and having a pulse greater than the pulse width of the clock signal;

logic gating means for permitting a truncated pulse to pass when the digital signal pulse corresponds to a digital "0" and for permitting an extended pulse to pass when the data pulse corresponds to a digital "1";

the logic gating means including means for creating an inverted digital signal, a first AND gate means having a first input terminal, a second input terminal, a pulse of truncated length being transmitted to the first input terminal, and the inverted digital signal being transmitted to the second input terminal;

the logic gating means further including a second AND gate having a first input terminal and second input terminal and an output terminal, the digital signal being transmitted to the first input terminal and a pulse of extended length being transmitted to the second input terminal;

the logic gating means further including an OR gate having a first input terminal and a second input terminal and an output terminal, the first input terminal being connected to the output terminal of the first AND gate, and the second input terminal being connected to the output terminal of the second AND gate;

whereby the output of the OR gate is an encoded signal where the leading edges of each pulse contains information as to the clock frequency and the trailing edge of each pulse contains the data information of the digital signal being encoded.

2. The electronic circuit according to claim 1 wherein the means for generating the truncated pulses and the means for generating the extended pulses is comprised of a dual one shot.

3. A decoder electronic circuit for decoding a pulse width encoded data signal where the leading edge of the pulse contains information as to the clock frequency and the trailing edge of each pulse containing data information of the encoded data signal comprising:

means for deriving a square wave slave clock signal from the leading edges of the pulses included in the encoded data signal;

decoder logic gating means for permitting the positive portions of the extended pulses which are of greater pulse width than the clock signal to pass through said decoder logic gating means;

the decoder logic gating means including means for creating an inverted clock signal, an AND gate means having a first input terminal, a second input terminal and an output terminal, the encoded data signal being transmitted to the first input terminal and the inverted clock signal being transmitted to the second input terminal;

means for receiving the output signal from the output terminal of the decoder logic gating means and for generating a digital data signal containing data information and consisting of a string of pulses of two different states, the pulse of the first state representing a digital "1" and the pulse of the second state representing a digital "0";

means for clocking the digital data signal into a shift register;

the shift register including means for transmitting an output digital signal corresponding to the digital data signal.

4. The decoder electronic circuit of claim 3 wherein the means for receiving the output signal from the decoder logic gating means and for generating a digital data signal is comprised of a dual one shot.

5. A method of encoding a digital signal containing data information consisting of a string of pulses of two different states, a pulse of the first state representing a digital "1" and a pulse of the second state representing a digital "0", comprising:

receiving the digital signal to be encoded from an external source which digital signal is clocked into a shift register means under control of a clock signal consisting of a square wave at a clock frequency;

generating a series of pulses of truncated length, the truncated pulses having a leading edge corresponding to a leading edge of the clock pulse and occurring at the clock frequency and having a pulse width less than the pulse width of the clock signal;

generating a string of pulses of extended length, the extended pulses having a leading edge corresponding to a leading edge of the clock pulse and occurring at the clock frequency and having a pulse width greater than the pulse width of the clock signal;

inverting the digital signal;

providing a first AND gate means having a first input terminal, and a second input terminal and an output terminal;

directing pulses of truncated length to the first input terminal of the first AND gate and directing the inverted signal to the second input terminal;

providing a second AND gate means having a first input terminal, a second input terminal and an output terminal;

directing pulses of extended length to the first input terminal of the second AND gate and directing the digital signal to the second input terminal;

providing an OR gate having a first input terminal, a second input terminal and an output terminal;

connecting the output terminal of the first AND gate to the first input terminal of the OR gate and connecting the output terminal of the second AND gate to the second input terminal of the OR gate;

whereby an encoded signal is produced at the output terminal of the OR gate, whereby the leading edge of each pulse contains information as to the clock frequency and the trailing edge of each pulse contains the data information of the digital signal to be encoded.

6. A method of decoding a pulse width encoded signal where the leading edge of each pulse contains information as to the clock frequency and the trailing edge of each pulse contains information of the encoded signal comprising:

generating a slave clock signal corresponding to the clock signal of the encoder circuit from the leading edges of the pulses included in the encoded signal;

gating the encoded signal for permitting the portions of the extended pulses which extend beyond the pulse width of the clock signal pulses, to pass;

receiving the gated portions of the extended pulses and generating a digital data signal having pulses of approximately the same width at the original digital signal to be encoded;

clocking the generated digital data signal into a shift register and transmitting a digital signal from the shift register corresponding to the original digital signal to be encoded.

* * * * *